United States Patent [19]
Van Buskirk

[11] Patent Number: 5,847,998
[45] Date of Patent: Dec. 8, 1998

[54] NON-VOLATILE MEMORY ARRAY THAT ENABLES SIMULTANEOUS READ AND WRITE OPERATIONS

[75] Inventor: Michael A. Van Buskirk, Saratoga, Calif.

[73] Assignee: Advanced Micro Devices, Inc., Sunnyvale, Calif.

[21] Appl. No.: 769,009

[22] Filed: Dec. 20, 1996

[51] Int. Cl.[6] .................................................. G11C 16/02
[52] U.S. Cl. .............................. 365/185.33; 365/185.13; 365/185.2; 365/185.06
[58] Field of Search ................. 365/185.33, 185.13, 365/185.2, 185.06, 189.02, 189.04, 230.05

[56] References Cited

U.S. PATENT DOCUMENTS

| | | | |
|---|---|---|---|
| 4,752,871 | 6/1988 | Sparks et al. | 365/185.11 |
| 5,007,022 | 4/1991 | Leigh | 365/189.04 |
| 5,241,510 | 8/1993 | Kobayashi et al. | 365/230.03 |
| 5,245,572 | 9/1993 | Kosonocky et al. | 365/189.02 |
| 5,276,642 | 1/1994 | Lee | 365/189.04 |
| 5,355,334 | 10/1994 | Koga et al. | 365/189.01 |
| 5,361,343 | 11/1994 | Kosonocky et al. | 365/185.11 |
| 5,506,810 | 4/1996 | Runas | 365/230.03 |
| 5,680,346 | 10/1997 | Pathak et al. | 365/185.1 |
| 5,684,752 | 11/1997 | Mills et al. | 365/230.03 |
| 5,691,955 | 11/1997 | Yamauchi | 365/233 |

FOREIGN PATENT DOCUMENTS

| | | |
|---|---|---|
| 0 212 451 | 3/1987 | European Pat. Off. . |
| 0 372 873 | 6/1990 | European Pat. Off. . |
| 0 376 285 | 7/1990 | European Pat. Off. . |
| 0 745 995 | 12/1996 | European Pat. Off. . |
| S61-246997 | 11/1986 | Japan . |
| 63-086197 | 4/1988 | Japan . |
| 63-611599 | 7/1988 | Japan . |
| H5-54682 | 3/1993 | Japan . |
| H7-281952 | 10/1995 | Japan . |

OTHER PUBLICATIONS

J., Kruckeberg, "Zweigeteiltes EEPROM: Gleichzeitig auslesen und beschreiben," *Elektronik*, No. 26, 1990, pp. 56–59.

Atmel, 4 Megabit 2.7–volt Battery–Voltage™ Flash with 256 K EEPROM CMOS Combination Memory—AT29BV432 Awake™ Memory Architecture, 1995, pp. 1–12.

Atmel, 4 Megabit 5–volt Flash with 256K E$^2$PROM Memory—AT29C432 ConcurrentFlash™, pp. 1–11.

*Primary Examiner*—Viet Q. Nguyen
*Assistant Examiner*—Andrew Q. Tran
*Attorney, Agent, or Firm*—Fliesler, Dubb, Meyer & Lovejoy LLP

[57] ABSTRACT

A non-volatile memory having a non-volatile memory array arranged as a plurality of sectors each containing an array of non-volatile memory cells. The non-volatile memory includes independent read and write paths and selection circuitry for each sector that enables a read operation from one of the sectors during a program or erase operation to one of the other sectors.

18 Claims, 4 Drawing Sheets

NON-VOLATILE MEMORY ARRAY THAT ENABLES SIMULTANEOUS READ AND WRITE OPERATIONS

BACKGROUND OF THE INVENTION

1. Field of Invention

The present invention pertains to the field of non-volatile memories. More particularly, this invention relates to a non-volatile memory array with an arrangement that enables simultaneous read and write operations.

2. Art Background

Electronic systems including relatively specialized systems commonly include processors such as microprocessors or microcontrollers. Such a processor typically executes a set of electronic system software or firmware designed to perform application-specific functions. Such electronic system software may be referred to as an operating system.

Typically, such an operating system maintains stored information in a main memory. Such an operating system usually requires relatively unhindered access to stored information in the main memory. In addition, such an operating system commonly maintains user specific information in non-volatile or persistent form. For example, cellular telephones commonly store telephone numbers as well as other cellular telephone specific information in a non-volatile memory. Such information may include microcontroller code for operating the cellular telephone.

The cost of such electronic systems may be reduced if a single memory could function as both a random access main memory and a non-volatile memory. Unfortunately, prior non-volatile memories typically do not provide suitable random access to a processor to function as a main memory while providing simultaneous write capability.

For example, prior flash memory devices typically do not allow a processor to perform a read operation while a program or erase operation is underway in the flash memory device. Typically, the processor periodically polls a status register of the flash memory device to detect the end of the program or erase operation before initiating a read operation to the flash memory device.

Unfortunately, the programming and erase cycle times for typical flash memory devices are orders of magnitude greater than acceptable read access times of a random access main memory. Such long latencies associated with programming or erase operations can lock up the operating system and prevent normal system functioning for unacceptably long time intervals if the flash memory is the only memory in the electronic system. Some prior flash memories allow erase suspend operations in order to address this problem. However, such memories typically impose a suspend latency interval of several microseconds before a read operation can be initiated.

Prior systems may employ multiple flash memory devices in an attempt to prevent such operating system lock up. In such systems, the processor usually has read access to one of the flash memory devices while other flash memory devices are undergoing a program or erase operation. However, such systems typically suffer from high cost because multiple flash memory devices are implemented even though the capacity of a single flash memory device may accommodate the particular operating system.

In addition, some computer systems maintain files on memory cards containing multiple non-volatile memory devices such as flash memory devices. Typically, deleted files on such a memory card are erased and the deleted file space is reclaimed. In memory cards that employ prior non-volatile memory devices, the memory devices undergoing such an erase operation are not available for read operation for the duration of the erase operation. Such delays in read operations increase memory access times and slow the overall speed of systems that employ such memory cards.

SUMMARY AND OBJECTS OF THE INVENTION

One object of the present invention is to enable simultaneous read and write operations in a single non-volatile memory device.

Another object of the present invention is to enable simultaneous read and program or erase operations in a flash memory semi-conductor chip.

Another object of the present invention is to enable simultaneous read and write operations in a non-volatile memory device without increasing the number of bit lines contained in the memory array.

A further object of the present invention is to provide a sectored non-volatile memory array with a dual port architecture that enables read operations in one sector while another sector is undergoing a program or erase operation.

Another object of the present invention is to minimize the cost of simultaneous read, write, and erase operations by multiplexing the functions of the sense amplifiers between read operations and write/erase-verify operations.

Another object of the present invention is to provide the capability for a read operation while performing a write or erase operation in the background without additional latency in order to realize SRAM-like capability in a non-volatile memory.

Another object of the present invention is to reduce access time to memory cards that employ multiple non-volatile memory devices by enabling read operations during erase operations in a given memory device.

These and other objects are provided by a flash memory semi-conductor chip having a plurality of sectors each containing a set of memory cells. The flash memory chip includes means for simultaneously reading from one of the sectors and writing or erasing to another of the sectors. The structure of the flash memory semi-conductor chip also enables simultaneous reading from one of the sectors and writing to another of the sectors and erasing of yet another of the sectors.

Other objects, features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
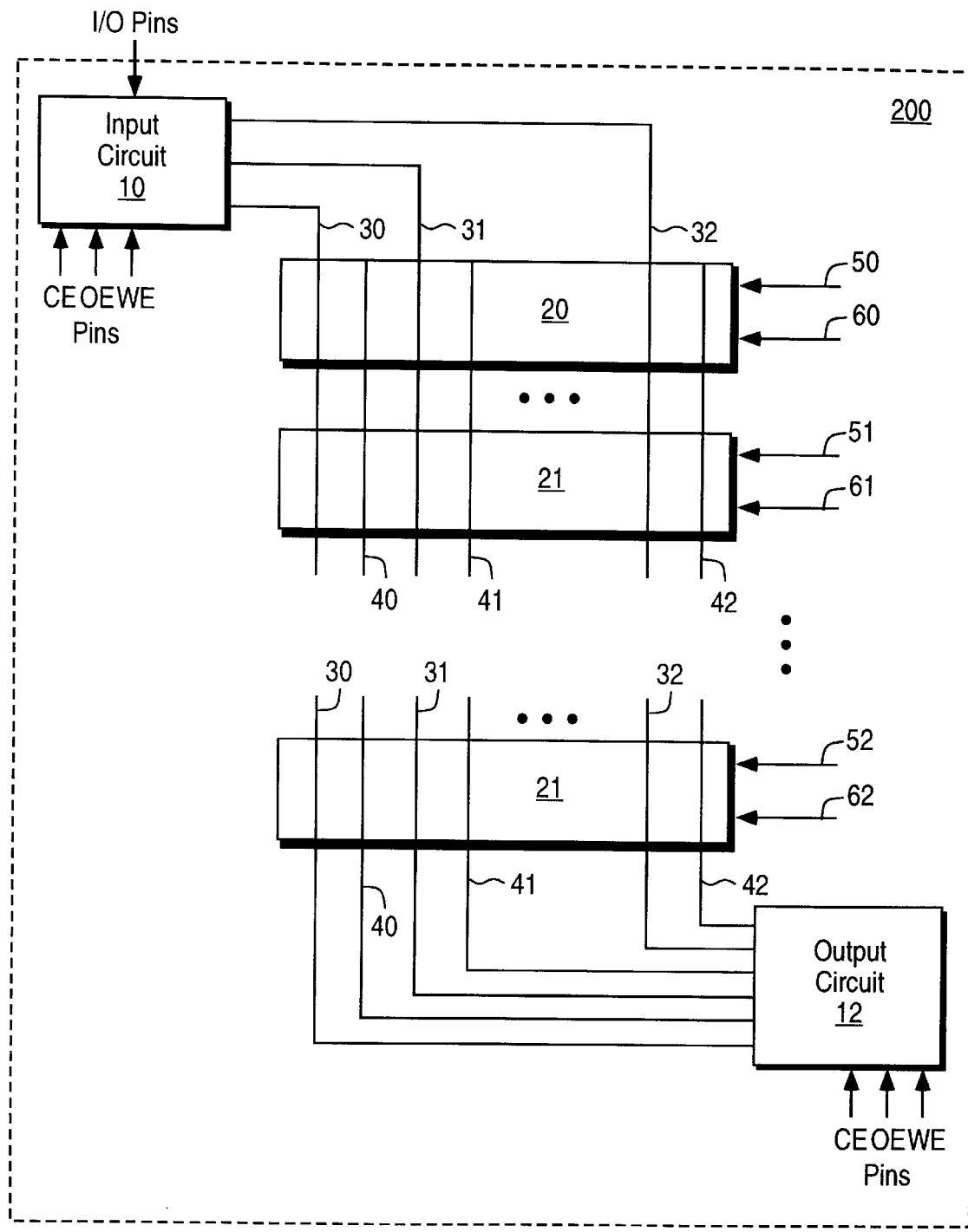
FIG. 1 illustrates a non-volatile memory device that enables simultaneous read and program/erase operations.

FIG. 1 illustrates a non-volatile memory device 200 that enables simultaneous read and write operations. The non-volatile memory device 200 includes a memory array subdivided into a set of array sectors 20–22 and further includes a dual-port structure and circuitry for simultaneous read and write operations. In one embodiment, the non-volatile memory device 200 is a flash memory and the write operations include programming operations and erase operations of flash memory cells.

The bit lines for the non-volatile memory device 200 are divided into a set of write bit lines 30–32 and an independent set of read bit lines 40–42. In one embodiment, the flash memory device 200 is contained on a single integrated circuit chip.

Each array sector 20–22 contains a sub-array of memory cells which are each accessible via the write bit lines 30–32 and the read bit lines 40–42. The write bit lines 30–32 enable an input circuit 10 and an output circuit 12 to access memory cells in the array sectors 20–22 during program and erase operations. The read bit lines 40–42 enable the output circuit 12 to access the memory cells 20–22 during read operations. Each array sector may be referred to as a dual port array sector with the write bit lines 30–32 coupled to a write port of each array sector and the read bit lines 40–42 coupled to a read port of each array sector.

In one embodiment, the write bit lines 30–32 and the read bit lines 40–42 are implemented as M2 metal lines that enable connection across the entire set of array sectors 20–22. M2 metal lines generally refer to a metalization layer in an integrated circuit device such as the non-volatile memory device 200 that provides electrical connections among local areas of the integrated circuit. The array sectors 20–22 each contain selection circuitry that selectively couples the write bit lines 30–32 or the read bit lines 42—42 to the corresponding memory cells.

The input circuit 10 receives addresses from input/output (I/O) pins of the memory device 200. The input circuit 10 reuses a chip enable (CE), an output enable (OE), and a write enable (WE) control pin to detect the occurrences of read and write operations for the memory device 200. The input circuit 10 generates a set of write sector select signals 50 that control the selection circuitry for the individual memory cells in the array sector 20 during program and erase operations. Similarly, the input circuit 10 generates sets of write sector select signals 51 and 52 that control selection circuitry for the individual memory cells in the array sectors 21 and 22, respectively, during program and erase operations.

The output circuit 12 generates a set of read sector select signals 60 that control selection circuitry for the individual memory cells in the array sector 20 during read operations. Similarly, the output circuit 12 generates sets of read sector select signals 61 and 62 that control selection circuitry for the memory cells in the array sectors 21 and 22, respectively, during read operations.

The arrangement of the write bit lines 30–32 and the read bit lines 40–42 in combination with the selection circuitry in the array sectors 20–22 enables a program or erase operation to occur in one of the array sectors 20–22 while a read operation occurs in another of the array sectors 20–22. For example, the input circuit 10 may perform a program or erase operation to the array sector 20 via the write bit line 30–32 while the output circuit 12 performs a read operation from the array sector 21 via the read bit lines 40–42.

The output circuit 12 includes sense amplifier circuitry for sensing the programmed or erased state of the individual memory cells in the array sectors 20–22 via the read bit lines 40–42 and the write bit lines 30–32. The sense amplifier circuitry in the output circuit 12 is used to perform read operations and the verify portion of program or erase operations.

In an alternative embodiment, the input circuit 10 contains a separate set of sense amplifier circuitry that enables verify operations independent of the sense amplifier circuitry in the output circuit 12.

Figure 2:
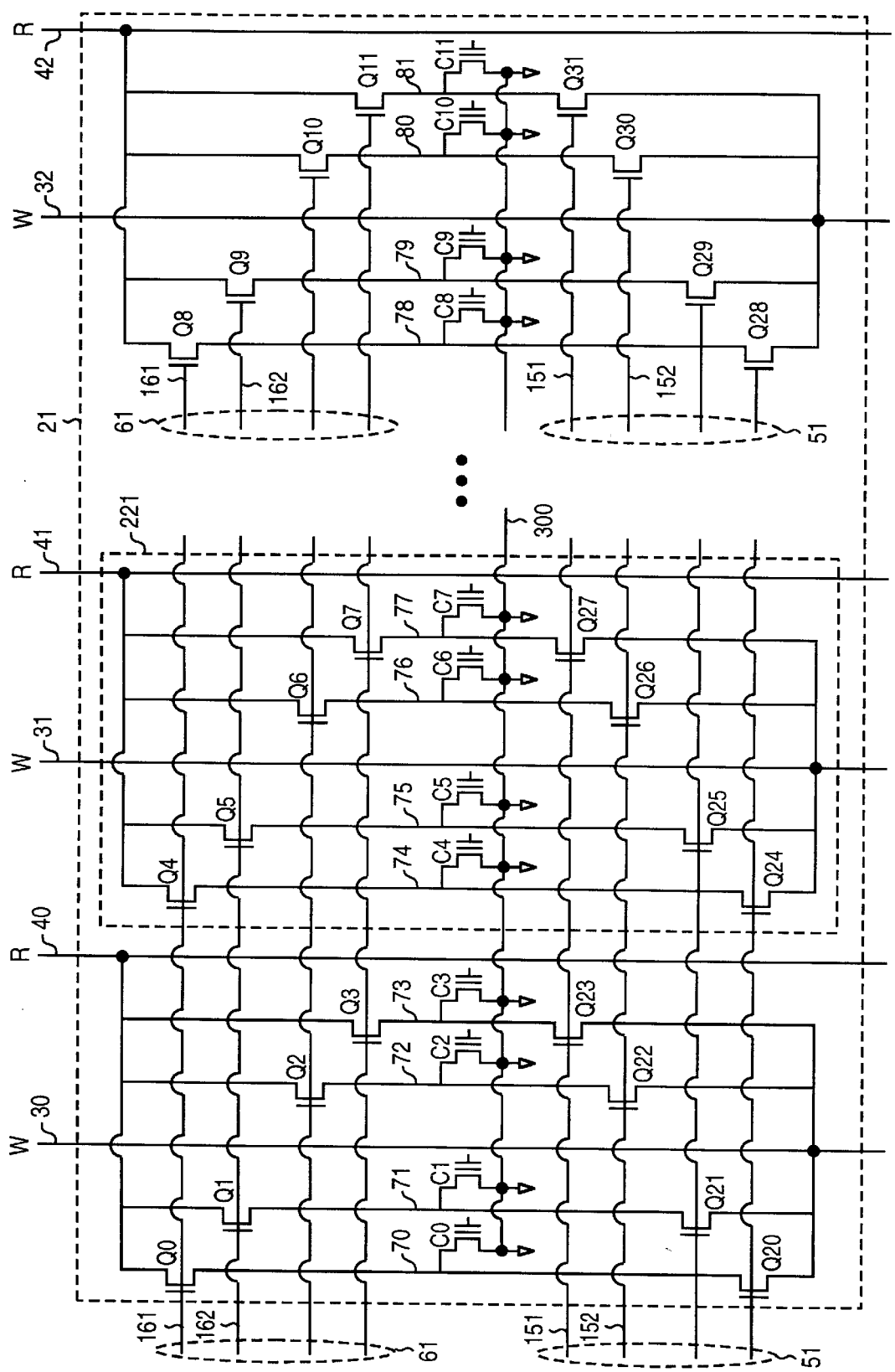
FIG. 2 illustrates an array sector for one embodiment that provides a dual port structure.

FIG. 2 illustrates the array sector 21 for one embodiment. The architecture of the array sector 21 provides a dual port structure which is substantially similar to that of the array sectors 20 and 22 with respect to the selection circuitry for the write bit lines 30–32 and the read bit lines 40–42.

The array sector 21 contains an array of memory cells C0–C11 which in one embodiment are implemented as flash memory cells. The memory cells C0–C11 are each coupled to a common VSS line 300 within the array sector 21. The selection circuitry in the array sector 21 includes a set of transistors Q0–Q11 and Q20–Q31 that selectively couple the write bit lines 30–32 and the read bit lines 40–42 to the memory cells C0–C11 as required by the particular read and program/erase operations. The transistors Q0–Q11 and the transistors Q20–Q31 function as pass gates that are controlled by the read sector select signals 61 and the write sector select signals 51, respectively.

The memory cells C0–C11 are individually coupled to a set of interconnect lines 70–81, respectively. Each of the interconnect lines 70–81 is implemented in the non-volatile memory device 200 as an M1 metal line in the array sector 21. M1 lines generally refer to local interconnect lines within an integrated circuit device such as the non-volatile memory device 200. The M1 interconnect lines 70–81 provide local interconnection to the memory cells C0–C11 within the array sector 21.

The transistors Q0–Q3 selectively couple the read bit line 40 to the memory cells C0–C3 under control of the read sector select signals 61. The transistors Q4–Q7 selectively couple the read bit line 41 to the memory cells C4–C7 under control of the read sector select signals 61. Similarly, the transistors Q8–Q11 selectively couple the read bit line 42 to the memory cells C8–C11 under control of the read sector select signals 61.

For example, the output circuit 12 activates a read sector select signal 161 to couple the memory cells C0, C4, and C8 to the read bit lines 40, 41, and 42, respectively, during read operation on the array sector 21. Similarly, the output circuit 12 activates a read sector select signal 162 to couple the memory cells C1, C5, and C9 to the read bit lines 40, 41, and 42, respectively, during a read operation on the array sector 21.

The transistors Q20–Q23 selectively couple the write bit line 30 to the memory cells C0–C3 under control of the write sector select signals 51. The transistors Q24–Q27 selectively couple the write bit line 31 to the memory cells C4–C7 under control of the write sector select signals 51. Similarly, the transistors Q28–Q31 selectively couple the write bit line 32 to the flash memory cells C8–C11 under control of the write sector select signals 51.

For example, the input circuit 10 activates a write sector select signal 151 to couple the memory cells C3, C7, and C11 to the write bit lines 30, 31, and 32, respectively, during a program or erase operation on the array sector 21. Similarly, the write circuit 12 activates a write sector select signal 152 to couple the memory cells C2, C6, and C10 to the write bit lines 30, 31, and 32, respectively, during a program or erase operation on the array sector 21.

This embodiment for the array sector 21 facilitates the implementation of column redundancy circuitry in the non-volatile memory device 200. For example, the circuitry 221 that includes the memory cells C4-7 and the transistors Q4–Q7 and Q24–Q27 can be isolated and replaced or substituted with similar redundant circuitry by employing any one of several well known means such as fusible links.

In other embodiments of the non-volatile memory device 200, only a subset of the array sectors 20–22 contain the selection circuitry that enables simultaneous read and program/erase operations. Such a restriction of simultaneous read and program/erase lowers the cost and die space consumed by the read bit line and write bit line selection circuitry for systems that require only small areas of random access to the non-volatile memory device 200.

Figure 3:
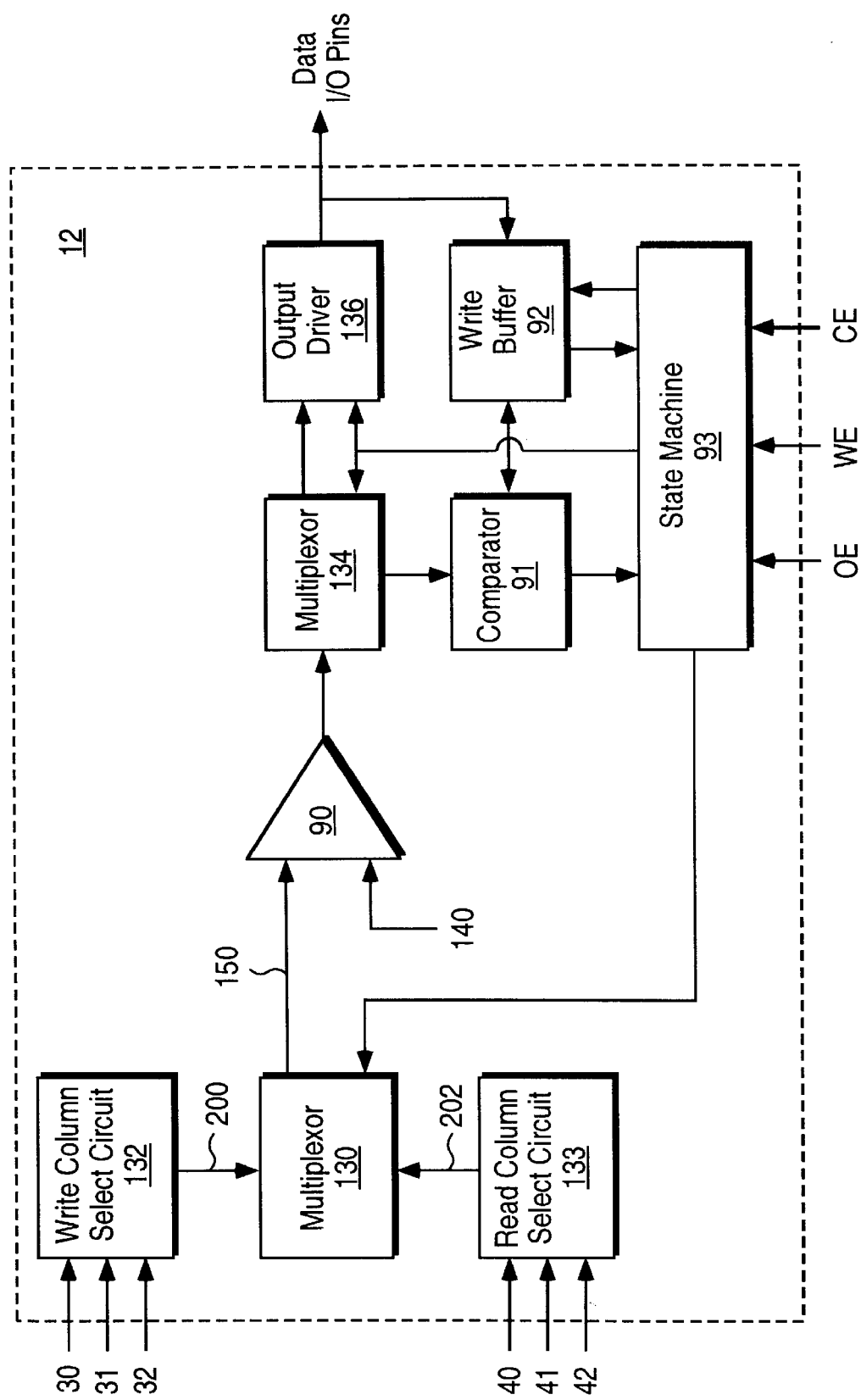
FIG. 3 illustrates an output circuit that enables sense amplifier sharing or multiplexing between read and verify operations.

FIG. 3 illustrates portions of the output circuit 12 in one embodiment. The output circuit 12 includes a sense amplifier circuit 90 which is shared for read operations, write-verify operations, and erase-verify operations.

The sense amplifier circuit 90 compares a set of input signals 150 to a reference voltage 140. The input signals 150 provide sense voltages which are supplied to the sense amplifiers 90 through a multiplexor 130 from selected flash memory cells in the array sectors 20–22. The reference voltage 140 is preselected to enable the sense amplifiers 90 to sense a programmed state or an erased state of flash memory cells.

The output circuit 12 includes a write column select circuit 132 and a read column circuit 133. The write column select circuit 132 selects a subset of the write bit lines 30–32 during a verify operation on one of the array sectors 20–22. The write column select circuit 132 transfers signals from the selected subset of the write bit lines 30–32 to the multiplexor 130 via a write data bus 200. The read column select circuit 133 selects a subset of the read bit lines 40–42 during a read operation on one of the array sectors 20–22. The read column select circuit 133 transfers signals from the selected subset of the read bit lines 40–42 to the multiplexor 130 via a read data bus 202.

A state machine 93 causes the multiplexor 130 to select either the signals on the write data bus 201 or the read databus 202 to drive the input signals 150. The state machine 93 selects the signals on the write data bus 200 during verify operations and selects the signals on the read bus 202 during read operations.

The state machine 93 determines the availability of the sense amplifier circuit 90 for a verify operation by sensing the logic state of an output enable (OE) control pin of the non-volatile memory device 200. The OE control pin may also be referred to as a read data (RD) control pin. The OE or RD control pin to the non-volatile memory device 200 indicates whether a read operation to the non-volatile memory device 200 is underway. The OE or RD control pin is driven by external circuitry such as a processor that performs read operations from the non-volatile memory device 200.

In one embodiment, the state machine 93 gives higher priority to read operations than to program or erase operations. The state machine 93 causes the multiplexor to select signals from the write data bus 201 only if the OE or RD control pin indicates that a read operation to one of the array sectors in the non-volatile memory device 200 is not underway.

The output circuit 12 includes a demultiplexer 134 that transfers outputs of the sense amplifier circuit 90 to either an output driver 136 or a comparator 91 under control of the state machine 93. The output driver 136 drives read data from the sense amplifier circuit 90 over the data input/output pins of the non-volatile memory device 200 during read operations. The comparator 91 compares the outputs of the sense amplifier circuit 90 to write/program data stored in a write buffer 92 during a verify operation. The results of the compare operation from the comparator 91 are transferred to the state machine 93 during the verify operation.

Figure 4:
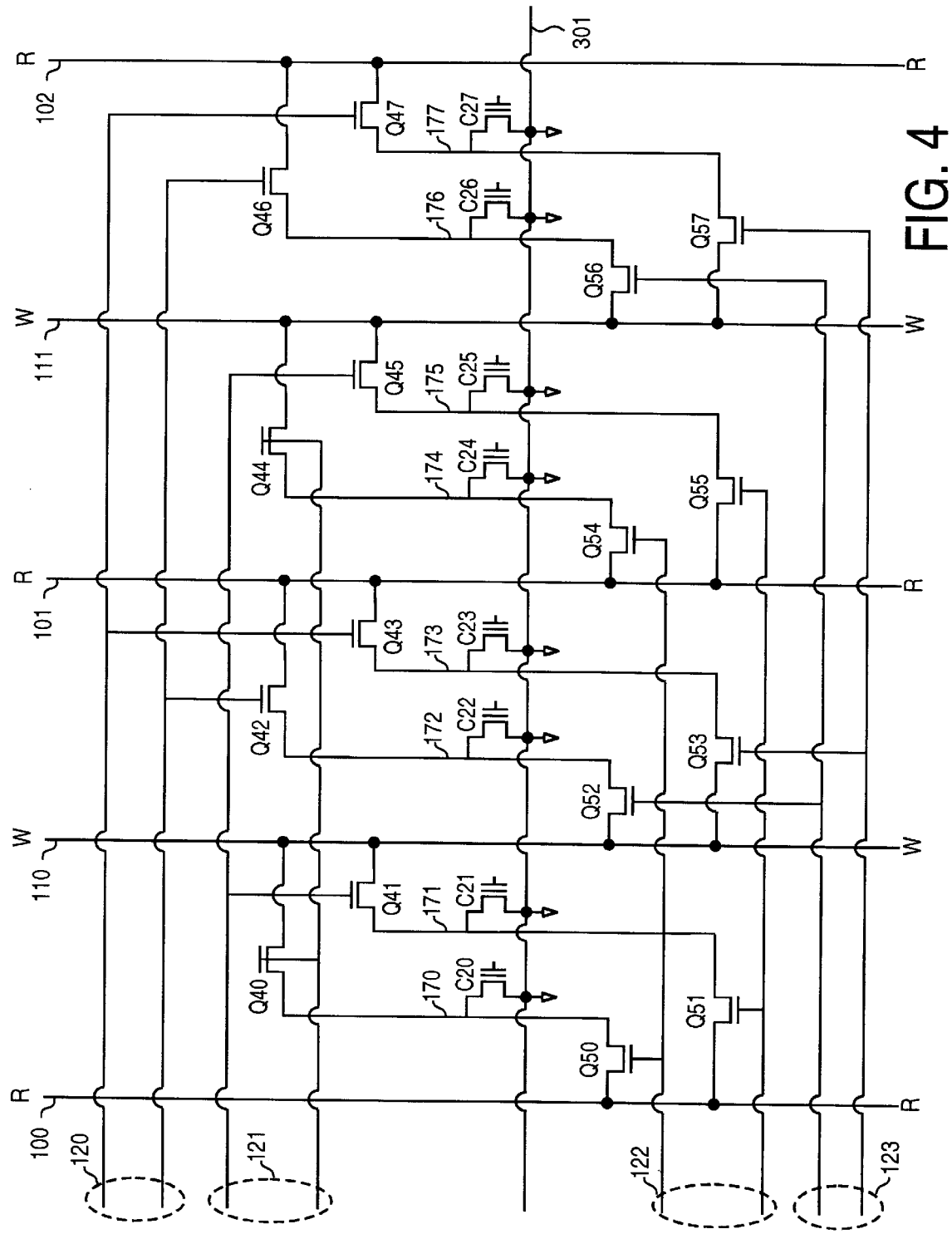
FIG. 4 illustrates an alternative embodiment of a dual-port array sector.

FIG. 4 illustrates an alternative embodiment of a dual-port array sector. In this embodiment, an array sector includes a set of memory cells C20–C27. A set of transistors Q40–Q47 and Q50–Q57 selectively couple a set of read bit lines 100–102 for a read port of the array sector and a set of write bit lines 110–111 for a write port of the array sector to the memory cells C20–C27.

The memory cells C20–C27 are coupled to a set of M1 lines 170–177. The M1 lines 170–177 provide local interconnect within the array sector. The read bit lines 100–102 and the write bit lines 110–111 are implemented as M2 lines that provide interconnect across array sectors in the non-volatile memory device. The memory cells C20–C27 are each coupled to a common VSS line 301 within the array sector.

The selection circuitry for this alternative embodiment includes a set of transistors Q40 and Q41 that selectively couples the write bit line 110 to the memory cells C20 and C21 under control of a set of write sector select signals 121. The selection circuitry also includes a set of transistors Q42 and Q43 that selectively couple the read bit line 101 to the memory cells C22 and C23 under control of a set of read sector select signals 120. The transistors Q44 and Q45 selectively couple the write bit line 111 to the memory cells C24 and C25 under control of the write sector select signals 121. The transistors Q46 and Q47 selectively couple the read bit line 102 to the memory cells C26 and C27 under control of the read sector select signals 120.

Similarly, the selection circuitry in this embodiment includes a set of transistors Q50 and Q51 to selectively couple the read bit line 100 to the memory cells C20 and C21 under control of the read sector select signals 122. The transistors Q52 and Q53 selectively couple the write bit line 110 to the memory cells C22 and C23 under control of the write sector select signals 123. The transistors Q54 and Q55 selectively couple the read bit line 101 to the memory cells C24 and C25 under control of the read sector select signals 122. The transistors Q56 and Q57 selectively couple the write bit line 111 to the memory cells C26 and C27 under control of the write sector select signals 123.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A flash memory device, comprising:

an array of flash memory cells;

a set of write bit lines;

a set of read bit lines;

a plurality of switching elements connected to said flash memory cells and said write bit lines or said read bit lines so that each flash memory cell can be selectively coupled to one of said write bit lines or one of said read bit lines; and a plurality of interconnection lines, each interconnection line connected to one of said flash memory cells and two switching elements.

2. A flash memory device according to claim 1, wherein:

said switching elements are transistors.

3. A flash memory device according to claim 1, wherein:
each switching element is connected to only one of either said write bit lines or said read bit lines.

4. A flash memory device according to claim 1, further comprising:
a set of selection lines connected to said switching elements for controlling whether a selected one of said flash memory cells is coupled to one of said write bit lines or one of said read bit lines.

5. A flash memory device, comprising:
an array of flash memory cells;
a set of write bit lines;
a set of read bit lines;
a plurality of switching elements connected to said flash memory cells, at least a first subset of said switching elements are connected to said read bit lines and selectively couple said read bit lines to said flash memory cells, at least a second subset of said switching elements are connected to said write bit lines and selectively couple said write bit lines to said flash memory cells; and
a plurality of interconnection lines, each interconnection line connected to one of said flash memory cells, one switching element from said first subset and one switching element from said second subset.

6. A flash memory device according to claim 5, wherein:
said switching elements are transistors.

7. A flash memory device according to claim 5, wherein:
said first subset of switching elements are not connected to said write bit lines; and
said second subset of switching elements are not connected to said read bit lines.

8. A flash memory device according to claim 5, wherein:
each flash memory cell is connected to one switching element from said first subset and one switching element from said second subset.

9. A flash memory device according to claim 5, further comprising:
a set of selection lines connected to said switching elements for controlling whether a selected one of said flash memory cells is coupled to one of said write bit lines or one of said read bit lines.

10. A flash memory device comprising:
a set of write bit lines;
a set of read bit lines;
two or more units, each unit being connected to said set of write bit lines and said set of read bit lines, each unit includes:
a plurality of flash memory cells,
a plurality of switching elements, each switching element connected to one of said flash memory cells and at least one of said write bit lines or one of said read bit lines so that each flash memory cell of said plurality of flash memory cells can be selectively coupled to one of said write bit lines or one of said read bit lines; and
a plurality of interconnection lines, each interconnection line connected to one of said flash memory cells and two switching elements.

11. A flash memory device according to claim 10, wherein:
each unit is a sector.

12. A flash memory device according to claim 10, further comprising:

a sense amplifier in communication with said write bit lines and said read bit lines.

13. A flash memory device according to claim 10, wherein:
said switching elements are transistors.

14. A flash memory device according to claim 10, further comprising:
a set of selection lines connected to said switching elements for controlling whether a selected one of said flash memory cells is coupled to one of said write bit lines or one of said read bit lines.

15. A flash memory device according to claim 10, wherein:
each switching element is connected to only one of either said write bit lines or said read bit lines.

16. A flash memory device, comprising:
a first write bit line;
a first read bit line;
a first selection line;
a second selection line;
a third selection line;
a fourth selection line;
a first flash memory cell;
a second flash memory cell;
a first pass gate connected to said first flash memory cell, said first selection line and said first write bit line so that when said first selection line is activated said first pass gate couples said first flash memory cell to said first write bit line;
a second pass gate connected to said second flash memory cell, said second selection line and said first write bit line so that when said second selection line is activated said second pass gate couples said second flash memory cell to said first write bit line;
a third pass gate connected to said first flash memory cell, said third selection line and said first read bit line so that when said third selection line is activated said third pass gate couples said first flash memory cell to said first read bit line;
a fourth pass gate connected to said second flash memory cell, said fourth selection line and said first read bit line so that when said fourth selection line is activated said fourth pass gate couples said second flash memory cell to said first read bit line;
a first interconnection line connected to said first pass gate, said third pass gate and said first memory cell; and
a second interconnection line connected to said second pass gate, said fourth pass gate and said second memory cell.

17. A flash memory device according to claim 16, wherein:
said first pass gate is a first transistor;
said second pass gate is a second transistor;
said third pass gate is a third transistor; and
said fourth pass gate is a fourth transistor.

18. A flash memory device according to claim 16, further comprising:
a second write bit line;
a second read bit line;
a third flash memory cell;
a fourth flash memory cell;
a fifth pass gate connected to said third flash memory cell, said first selection line and said second write bit line so that when said first selection line is activated said fifth pass gate couples said third flash memory cell to said second write bit line;

a sixth pass gate connected to said fourth flash memory cell, said second selection line and said second write bit line so that when said second selection line is activated said sixth pass gate couples said fourth flash memory cell to said second write bit line;

a seventh pass gate connected to said third flash memory cell, said third selection line and said second read bit line so that when said third selection line is activated said seventh pass gate couples said third flash memory cell to said second read bit line; and a eighth pass gate connected to said fourth flash memory cell, said fourth selection line and said second read bit line so that when said fourth selection line is activated said eighth pass gate couples said fourth flash memory cell to said second read bit line.

* * * * *